United States Patent [19]

Sander et al.

[11] 4,322,491

[45] Mar. 30, 1982

[54] MIXTURE WHICH IS POLYMERIZABLE BY RADIATION, AND RADIATION-SENSITIVE COPYING MATERIAL PREPARED THEREWITH

[75] Inventors: Jürgen Sander, Kelkheim; Klaus Horn, Hofheim, both of Fed. Rep. of Germany

[73] Assignee: Hoechst Aktiengesellschaft, Fed. Rep. of Germany

[21] Appl. No.: 220,090

[22] Filed: Dec. 24, 1980

[30] Foreign Application Priority Data

Dec. 29, 1979 [DE] Fed. Rep. of Germany ....... 2952697

[51] Int. Cl.³ .............................................. G03C 1/68
[52] U.S. Cl. ............................. 430/286; 204/159.15; 204/159.16; 204/159.22; 430/281; 430/287; 430/288; 526/306; 526/315; 526/316; 526/321; 526/322
[58] Field of Search ............... 430/281, 286, 287, 288; 204/159.15, 159.16, 159.22; 526/306, 315, 316, 321, 333

[56] References Cited

U.S. PATENT DOCUMENTS

| | | | |
|---|---|---|---|
| 2,437,421 | 3/1948 | D'Alelio | 526/333 |
| 2,445,379 | 7/1948 | Young et al. | 526/333 |
| 3,748,131 | 7/1973 | Reynolds et al. | 430/287 |
| 4,048,035 | 9/1977 | Ide et al. | 204/159.15 |
| 4,225,661 | 9/1980 | Muzyczko | 430/288 |
| 4,232,106 | 11/1980 | Iwasaki et al. | 430/288 |

*Primary Examiner*—Jack P. Brammer
*Attorney, Agent, or Firm*—James E. Bryan

[57] ABSTRACT

This invention relates to an improvement in a mixture which is polymerizable by radiation and contains, as the essential constituents, (a) a polymeric binder, (b) a polymerization initiator which can be activated by radiation, and (c) a compound of the formula I

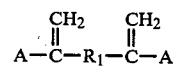

in which $R_1$ is a divalent aliphatic group having 1 to 15 carbon atoms which also can be partially replaced by hetero-atoms, a divalent cycloaliphatic group having 3 to 15 carbon atoms, or a mixed aliphatic-aromatic group having 7 to 15 carbon atoms, and A is an electron-attracting radical. The invention also relates to a radiation-sensitive resist material using the improved radiation-polymerizable mixture.

10 Claims, No Drawings

MIXTURE WHICH IS POLYMERIZABLE BY RADIATION, AND RADIATION-SENSITIVE COPYING MATERIAL PREPARED THEREWITH

This invention relates to a mixture which is polymerizable by radiation, in particular a photopolymerizable mixture, which contains, as the essential constituents, (a) a compound which is polymerizable by a free-radical mechanism and has terminal ethylenically unsaturated groups, (b) a polymeric binder and (c) an initiator which can be activated by radiation.

Polymerizable mixtures of this type have been disclosed, for example, in U.S. Pat. Nos. 2,760,863, 3,060,023, and 3,149,975. The polymerizable, ethylenically unsaturated compounds described in these patent specifications are low-molecular weight and high-molecular weight compounds having terminal or side-chain vinyl groups or vinylidene groups, in particular acrylates and methacrylates of low-molecular or high-molecular weight polyhydroxy compounds. In practice, photopolymerizable materials based on esters of this type as the polymerizable compounds have gained acceptance almost exclusively. Among these, the low-molecular weight representatives in particular are preferentially employed in industry.

Although these compounds give mixtures having a high light-sensitivity in practice and give exposed products having a high cross-linking density, it would be desirable in some cases to have compounds available, which have different properties, for example a lower volatility and tackiness or a higher resistance to saponifying agents. German Offenlegungsschrift No. 2,556,845, discloses photopolymerizable mixtures which, as the polymerizable compounds, contain unsaturated polyesters of dicarboxylic acids which have a methylene group in the α-position. These compounds possess many desired mechanical and chemical properties. The light-sensitivity of the mixtures prepared from these, however, does not reach that of the preferred acrylates.

It is the object of the invention to provide mixtures which can be polymerized by radiation and which, in their radiation-sensitivity, are at least comparable to the known mixtures based on acrylates, but do not contain any volatile polymerizable compounds, do not give tacky layers or layers tending to crystallization, and the photo-cross-linking products of which have a high resistance to aggressive agents, for example saponifying agents.

The subject of the invention is a mixture which is polymerizable by radiation and contains, as the essential constituents, (a) a preferably saturated polymeric binder,
(b) a polymerization initiator which can be activated by radiation, and
(c) a compound of the formula I

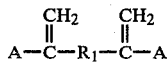

in which $R_1$ is a divalent aliphatic group having 1 to 15 carbon atoms which also can be partially replaced by hetero-atoms, a divalent cycloaliphatic group having 3 to 15 carbon atoms, or a mixed aliphatic-aromatic group having 7 to 15 carbon atoms, and A is an electron-attracting radical.

The electron-attracting radical A preferably is a radical which is bonded via a carbon atom or a nitrogen atom and in which this atom is bonded to at least one oxygen, nitrogen or sulfur atom.

If the radical A is bonded via a carbon atom to the unsaturated units, the carbon atom has a hetero-functionality of two or three. This means that the carbon atom can, by its free valences, form bonds with one, two or three hetero-atoms in the form of single bonds, double bonds or triple bonds.

Examples of electron-attracting radicals A are nitro groups, ethylsulfonyl groups, phenylsulfonyl groups, methylsulfonyl groups, methylsulfinyl groups, methoxysulfinyl groups, dimethoxyphosphinyl groups, methylmethoxyphosphinyl groups, dimethylphosphinyl groups, nitrile groups, carboxylic acid ester groups, carboxylic acid groups, keto groups and aldehyde groups, and in particular those groups which correspond to readily accessible ketone derivatives or acid derivatives, preferably aldehyde groups, keto groups, azomethine groups, oxime groups, hydrazone groups, thioaldehyde groups, thioketone groups, acid groups, ester groups, anhydride groups, amide groups, imide groups, acid azide groups, thioester groups, thionoester groups, dithioester groups, imidoester groups, amidine groups and imido-thioester groups.

A special group of compounds of the general formula I is represented by compounds of the formula II

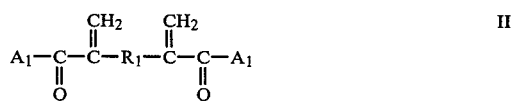

$R_1$ here has the meaning given above.

$A_1$ is a hydrogen atom, a hydroxyl or amino group or an alkyl, aryl, alkoxy, aryloxy, alkylamino, arylamino, alkylthio, arylthio, acyloxy, acylamino, sulfonyloxy or sulfonylamino radical.

The compounds of the formula II are intended to comprise aldehydes, ketones and acids, as well as derivatives thereof, which can be readily prepared.

In addition to the dicarboxylic acids, the esters of the formula III

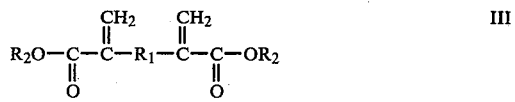

are a preferred group of compounds of the formula II.

$R_1$ here has the meaning given above.

$R_2$ is an alkyl or alkenyl radical having 1 to 15 carbon atoms which also can be partially replaced by hetero-atoms, such as O, S or N, in particular O, a cycloalkyl radical having 3 to 15 carbon atoms or an aralkyl radical having 7 to 15 carbon atoms, preferably an alkyl radical having 1 to 4 carbon atoms, particularly preferably the methyl or ethyl radical.

Possible groups $R_1$ are, for example, methylene, 1,2-ethylene, 1,3-propylene, 2-oxa-1,3-propylene, 2,2-dimethyl-1,3-propylene, 2,2-diethyl-1,3-propylene, 1,4-butylene, 1,5-pentylene, 1,6-hexylene, 2-ethyl-1,6-hexylene, 2,3-dimethyl-1,6-hexylene, 1,7-heptylene, 1,8-octylene, 1,9-nonylene, 3,6-dimethyl-1,9-nonylene, 1,10-decylene, 1,12-dodecylene, cyclohexylene-1,4-bis-methylene, 1,4-but-2-enylene, o-, m- and p-xylylene, 3-thia-1,5-pentylene, 3-oxa-1,5-pentylene, 3,6-dioxa-1,8-octylene, 3,6,9-trioxa-1,11-undecylene, 3,6,9,12-tetraoxa-1,14-tetradecylene, and 4-oxa-1,7-heptylene groups.

Examples of suitable alkyl radicals $R_2$ are methyl, ethyl, propyl, allyl, butyl, pentyl, hexyl, heptyl, octyl, nonyl, decyl, undecyl, dodecyl, 2-phenoxy-ethyl, 2-oxa-5-methoxy-pentyl, 2-bromo-ethyl, 2-methoxy-ethyl, 2-phenyl-ethyl, 2-oxa-5-ethoxy-pentyl, 2-oxa-5-butoxy-pentyl, 2-ethyl-butyl and 2-methyl-butyl radicals.

The preparation of the polymerizable compounds I is accomplished for example, by a direct condensation reaction of readily accessible compounds IV with formaldehyde,

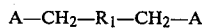

$$A-CH_2-R_1-CH_2-A \qquad IV$$

if the electron-attracting groups A are, for example, aldehyde groups, keto groups or nitro groups. In general, the condensation reaction is facilitated, or even made possible at all, if the compounds IV are additionally activated; in particular, activation with the aid of carboxyl groups in the form of the compounds

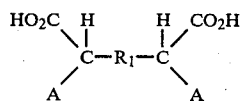

has proved suitable, because the reaction of the dicarboxylic acids V with formaldehyde leads to the compounds I under very gentle reaction conditions, with simultaneous decarboxylation.

Because these compounds V can be readily prepared, for example by double alkylation of methylene-active compounds $A-CH_2-CO_2$-alkyl with dibromo compounds $Br-R_1-Br$ and subsequent saponofication of the bis-alkylation products VI formed

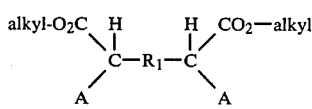

there is a simple route to the polymerizable compounds I.

In addition to varying the alkylene radical $R_1$ by employing different bis-halogen compounds, in particular dibromo compounds, for example 1,2-dibromo-ethane, 1,3-dibromo-propane, 2,2-dimethyl-1,3-dibromo-propane, 1,4-dibromo-butane, 1,5-dibromo-pentane, 1,6-dibromo-hexane, 2,3-dimethyl-1,6-dibromo-hexane, 1,7-dibromo-heptane, 1,8-dibromo-octane, 1,9-dibromo-nonane 3,6-dimethyl-1,9-dibromo-nonane, 1,10-dibromo-decane, 1,12-dibromo-dodecane, 1,4-bis-(bromomethyl)-cyclohexane, o-, m- and p-xylylene dichloride, 3-thia-1,5-dibromo-pentane, 3-methyl-, 1,5-dibromo-pentane, 3-oxa-1,5-dibromo-pentane, 3,6-dioxa-1,8-dibromo-octane, 3,6,9-trioxa-1,11-dibromo-undecane, 3,6,9,12-tetraoxa-1,14-dibromo-tetradecane and 4-oxa-1,7-dibromo-heptane, a variation of the electron-attracting group A is also possible by selecting different methylene-active compounds, in particular the methyl esters or ethyl esters of malonic acid and cyano-acetic acid.

The use of these methylene-active compounds ensures both a ready conversion to the compounds VI and a ready further reaction of the nitrile function or ester function. Thus, for example, nitriles and esters can be readily saponified to acids. In the case of acids, a conversion, inter alia, to nitriles and ketones is possible in turn.

Oximes and hydrazones, for example, can be readily prepared as derivatives of aldehydes and ketones, while acids can be readily reacted with aliphatic hydroxy compounds, activated isocyanates and isothiocyanates, and activated chlorine compounds, for example acid chlorides.

Bis-acid chlorides which are readily obtainable from the dicarboxylic acids of the formula II, react in turn, for example, with ammonia, aliphatic and aromatic amines, aromatic hydroxy compounds, and aliphatic and aromatic thio compounds, acids, amides and organometallic compounds.

Examples of the reaction partners of the dicarboxylic acids II and their bis-acid chlorides are: propanol, allyl alcohol, butanol, pentanol, hexanol, heptanol, octanol, nonanol, decanol, undecanol, dodecanol, bromoethanol, ethylene glycol monomethyl ether, ethylene glycol monophenyl ether, 2-phenyl-ethanol, diethylene glycol monomethyl ether, hydroxymethylcyclohexane, ethoxycarbonyl isocyanate, benzoyl isocyanate, benzoyl isothiocyanate vinylsulfonyl isocyanate, acetyl chloride, benzoyl chloride, acryloyl chloride, methacryloyl chloride, ethyl chloroformate, dimethylcarbamic acid chloride, ammonia, methylamine, dimethylamine, ethylamine, diethylamine, aniline, N-methylaniline, phenol, naphthol, p-methoxyphenol, cumylphenol, p-pheoxyphenol, ethyl mercaptan, thiophenol, acetamide, benzamide, acrylamide and methacrylamide.

The polymerizable compounds I prepared in this way, some of which are described in the literature, for example, in the Journal of the American Chemical Society 79, 5,771 (1957), Journal of the American Chemical Society 81, 984 (1959), Synthesis 29 (1979), Journal of Macromolecular Science, Chem. A5, 181 (1971), Comptes Rendues 2,237 (1961) and Journal für Praktische Chemie 313, 205 (1971), in general, after distillation or crystallization, can be reproducibly isolated in the form of a single compound.

As a result of using the polymerizable compounds of the formula I or mixtures thereof, the material properties of the recording materials prepared therewith can be varied widely.

Examples of suitable compounds I are the alkyl esters of the following acids which have different alkylene radicals $R_1$: hexa-1,5-diene-2,5-dicarboxylic acid, hepta-1,6-diene-2,6-dicarboxylic acid, 4-oxa-hepta-1,6-diene-2,6-dicarboxylic acid, 4,4-dimethyl-hepta-1,6-diene-2,6-dicarboxylic acid, 4,4-diethyl-hepta-1,6-diene-2,6-dicarboxylic acid, octa-1,7-diene-2,7-dicarboxylic acid, nona-1,8-diene-2,8-dicarboxylic acid, deca-1,9-diene-2,9-dicarboxylic acid, undeca-1,10-diene-2,10-dicarboxylic acid, dodeca-1,11-diene-2,11-dicarboxylic acid, trideca-1,12-diene-2,12-dicarboxylic acid, tetradeca-1,13-diene-2,13-dicarboxylic acid, hexadeca-1,15-diene-2,15-dicarboxylic acid, 5-oxa-nona-1,8-diene-2,8-dicarboxylic acid, 5-thia-nona-1,8-diene-2,8-dicarboxylic acid, octa-1,4,7-triene-2,7-dicarboxylic acid, 6-oxa-undeca-1,10-diene-2,10-dicarboxylic acid, 5,8-dioxa-dodeca-1,11-diene-2,11-dicarboxylic acid, 5,8,11-trioxa-pentadeca-1,14-diene-2,14-dicarboxylic acid, 1,2-bis-(2-carboxy-prop-2-enyl)-benzene, 1,3-bis-(2-carboxyl-prop-2-enyl)-benzene, 1,4-bis-(2-carboxy-prop-2-enyl)-benzene, and 1,4-bis-(2-carboxy-prop-2-enyl)-cyclohexane.

It has been found that copying layers containing compounds of the formula I, in which the radical $R_1$ consists of a chain containing 3 atoms, for example of the 1,3-propylene, 2-oxa-1,3-propylene or 2,2-dimethyl-1,3-propylene radical, have the highest light-sensitivity, because it is possible that cyclopolymerization reactions can proceed additionally. This applies in particular to compounds I which contain the trimethylene radical as $R_1$.

Suitable compounds I of this type are, for example, 2,6-dinitri-hepta-1,6-diene, 2,6-bis-(ethylsulfonyl)-hepta-1,6-diene, 2,6-bis-(phenylsulfonyl)-hepta-1,6-diene, 2,6-bis-(dimethoxyphosphinyl)-hepta-1,6-diene, 2,6-dicyano-hepta-1,6-diene, 2,6-diformyl-hepta-1,6-diene, 2,6-bis-(oximino)-hepta-1,6-diene, 2,6-bis-phenylhydrazino-hepta-1,6-diene, 2,6-diacetyl-hepta-1,6-diene, 2,6-dibenzoyl-hepta-1,6-diene, hepta-1,6-diene-2,6-dicarboxylic acid, dimethyl hepta-1,6-diene-2,6-dicarboxylate, diethyl hepta-1,6-diene-2,6-dicarboxylate, diphenyl hepta-1,6-diene-2,6-dicarboxylate, ethyl hepta-1,6-diene-2,6-dithiocarboxylate, phenyl hepta-1,6-diene-2,6-dithiocarboxylate, hepta-1,6-diene-2,6-dicarboxylic acid amide, hepta-1,6-diene,2,6-dithiocarboxylic acid amide, hepta-1,6-diene-2,6-dicarboxylic acid ethylamide, hepta-1,6-diene-2,6-dicarboxylic acid diethylamide, hepta-1,6-diene-2,6-dicarboxylic acid anilide and the mixed imides and anhydrides obtained from hepta-1,6-diene-2,6-dicarboxylic acid and acetic acid, benzoic acid, acrylic acid or methacrylic acid.

A substantial advantage of the mixtures according to the invention is now that the polymerizable compounds I, which can be prepared uniformly and reproducibly, in particular those which contain the trimethylene radical $R_1$, are responsible for the very high light-sensitivity in the copying layer. The varying demands which are made in practice on copying layers can then be met by the selection of suitable electron-attracting groups A.

In this way, for example, the compatibility of the new polymerizable compounds with binders and also the flexibility, the mechanical strength, the solvent resistance or the ability of the layer to be developed can be adapted to the varying requirements.

Advantageously, conventional polymerizable compounds which contain two or more polymerizable acrylate or methacrylate groups, can be added to the compounds according to the invention; in this case, care must of course be taken to ensure that the advantages which are obtained by the use of the new polymerizable compounds in the photopolymerizable mixture, as discussed above, are not unduly reduced by these conventional compounds. In general, not more than 70 percent by weight of the total quantity of monomers, preferably not more than 60 percent, should consist of acrylates.

Among the known polymerizable compounds, acrylates or methacrylates of polyhydric aliphatic alcohols are especially preferred, and very particularly compounds of the formula

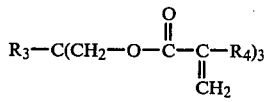

wherein $R_3$ denotes H, an alkyl group having 1 to 6 carbon atoms, preferably a methyl or ethyl group, a nitro group or a methylol group, and $R_4$ denotes H or a methyl group.

Examples of suitable compounds of this formula are triacrylates and trimethacrylates of trimethylolmethane, trimethylolethane, trimethylolpropane, trimethylolnitromethane and pentaerythritol.

The total amount of polymerizable compounds in the photopolymerizable mixture is in general between about 10 and 80, preferably between 20 and 60, percent by weight.

Depending on the planned application and depending on the desired properties, the new photopolymerizable mixtures can contain diverse substances as additives. Examples are: inhibitors to prevent thermal polymerization of the compositions, hydrogen donors, substances which modify the sensitometric properties of such layers, dyestuffs, colored and uncolored pigments, color precursors, indicators, plasticizers and the like.

These constituents advantageously should be selected in such a way that they have the lowest possible absorption in the range of actinic radiation, important for the initiation process.

Within the scope of this invention, actinic radiation is to be understood as any radiation, the energy of which corresponds at least to that of shortwave visible light. Longwave UV radiation, and also electron radiation, X-rays and laser radiation are particularly suitable.

A large number of substances can be used as photoinitiators in the mixture according to the invention. Examples are benzoin, benzoin ethers, polynuclear quinones, for example 2-ethyl-anthraquinone, acridine derivatives, for example 9-phenyl-acridine, 9-p-methoxyphenyl-acridine, 9-acetylamino-acridine and benzo(a)acridine; phenazine derivatives, for example 9,10-dimethylbenzo(a)phenazine, 9-methyl-benzo(a)phenazine and 10-methoxy-benzo(a)phenazine; quinoxaline derivatives, for example 6,4',4''-trimethoxy-2,3-diphenylquinoxaline and 4',4''-dimethoxy-2,3-diphenyl-5-azaquinoxaline; quinazoline derivatives and certain trichloromethyl-s-triazines. The amount of photoinitiator is in general between 0.1 and 10% by weight, relative to the non-volatile constituents of the mixture.

If the imaging is carried out with electron radiation, those photoinitiators, the absorption ranges of which are in the shorter-wavelength part of the electromagnetic spectrum and which thus have a low sensitivity to daylight, are also suitable, in addition to the known photoinitiators which are sensitive to visible light and near UV light. This has the advantage that the recording materials can be handled without excluding light and that the storage-stability of the materials can be increased.

Examples of starters of this type, which may be mentioned, are tribromomethyl-phenyl-sulfone, 2,2',4,4',6,6'-hexabromo-diphenylamine, pentabromoethane, 2,3,4,5-tetrachloro-aniline, pentaerythritol tetrabromide, chloroterphenyl resins or chlorinated paraffins.

The hydrogen donors used are in the main aliphatic polyethers. If appropriate, this function also can be fulfilled by the binder or by the polymerizable monomer, if these have labile hydrogen atoms.

A large number of soluble organic, preferably saturated polymers can be employed as the binders. Examples are: polyamides, polyvinyl esters, polyvinyl acetals, polyvinyl ethers, polyacrylates, polymethacrylates, polyesters, alkyd resins, polyacrylamide, polyvinyl alcohol, polyethylene oxide, polydimethylacrylamide, polyvinylpyrrolidone, polyvinylmethylformamide, polyvinylmethylacetamide and copolymers of the monomers which form the homopolymers enumerated.

Other possible binders are natural substances or modified natural substances, for example gelatin, cellulose ethers and the like.

With particular advantage, those binders are used which are insoluble in water but soluble or at least swellable in aqueous-alkaline solutions, because layers containing such binders can be developed with the preferred aqueous-alkaline developers. Binders of this type can, for example, contain the following groups: —COOH, —PO$_3$H$_2$, —SO$_3$H, —SO$_2$NH$_2$, —SO$_2$—NH—CO— and the like. Examples of these are: maleate resins, polymers of $\beta$-methacryloyloxy-ethyl N-(p-tolyl-sulfonyl)-carbamate and copolymers of these and similar monomers with other monomers and styrene/maleic anhydride copolymers. Methyl methacrylate/methacrylic acid copolymers, and copolymers of methacrylic acid, alkyl methacrylates and methyl methacrylate and/or styrene, acrylonitrile and the like, such as are described in German Auslegeschriften Nos. 2,064,080 and 2,363,806, are preferred.

The amount of binder is in general 20 to 90, preferably 40 to 80, percent by weight of the non-volatile constituents of the mixture.

The photopolymerizable mixture can be employed for the most diverse applications, for example for the manufacture of safety glass, of lacquers which are cured by light or corpuscular radiation, for example electron beams, in the field of dentistry and in particular as a light-sensitive copying material in the field of reproduction.

The detailed description of the invention is restricted to this field of application, but does not limit the invention thereto. Possible applications in this field are: copying layers for the photomechanical production of printing forms for letterpress printing, planographic printing, gravure printing and screen printing, of relief copies, for example the production of texts in Braille, of individual copies, tanned images, pigment images and the like. Moreover, the mixtures can be used for the photomechanical preparation of etch resists, for example for the production of nameplates, of printed circuits and for chemical milling. The mixtures according to the invention are of particular importance as copying layers for the photomechanical production of planographic printing forms and of etch resists, in particular as presensitized materials.

The commercial use of the mixture for the applications mentioned can take place in the form of a fluid solution or dispersion, for example as a so-called photoresist composition, which is applied by the user himself to an individual support, for example for chemical milling, for the production of printed circuits, of screen printing stencils and the like. The mixture also can be present as a solid light-sensitive layer on a suitable support in the form of a light-sensitive copying material, which has been precoated in such a way that it is stable in storage, for example for the production of printing forms. It is likewise suitable for the production of dry resists.

In general, it is advantageous largely to protect the mixtures from the influence of atmospheric oxygen during the light polymerization. In the case of using the mixture in the form of thin copying layers, it is advisable to apply a suitable cover film which has a low permeability to oxygen. This film can be self-supporting and can be peeled off before developing the copying layer. For example, polyester films are suitable for this purpose. The cover film can also consist of a material which dissolves in the developer fluid or at least can be removed during development from the uncured areas. Examples of materials suitable for this purpose are waxes, polyvinyl alcohol, polyphosphates, sugars and the like.

Examples of suitable supports for copying materials produced with the mixture according to the invention, are aluminum, steel, zinc, copper and plastic films, for example films of polyethylene terephthalate or cellulose acetate, and screen printing supports, such as gauze of polyamide-6. In many cases, it is advantageous to subject the surface of the support to a (chemical or mechanical) pretreatment, which has the object of correctly adjusting the adhesion of the layer or of reducing the reflectance of the support in the actinic range of the copying layer (anti-halation).

The manufacture of the light-sensitive materials, using the mixture according to the invention, is carried out in known manner.

Thus, this mixture can be taken up in a solvent and the solution or dispersion can be applied as a film to the envisaged support by slot-die coating, spraying, dipping, roller application and the like, and the film can be subsequently dried thereon. Thick layers (for example layers of 250 $\mu$m and higher) are advantageously prepared by extrusion as a self-supporting film which, if appropriate, is then laminated to the support. In the case of dry resists, solutions of the mixture are applied to transparent supports and dried thereon. The light-sensitive layers thus obtained—of a thickness between about 10 and 100 $\mu$m—are then laminated, together with the temporary support, to the desired substrate.

The processing of the copying materials is carried out in known manner. For developing, they are treated with a suitable developer solution, preferably a weakly alkaline aqueous solution, the unexposed constituents of the layer being removed and the exposed areas of the copying layer remaining on the support.

In the following text, examples of the mixture according to the invention are given. Initially, the preparation of a number of new polymerizable compounds is described here. In the copying materials according to the invention, the compounds were numbered consecutively as polymerizable compounds 1–48, and they recur under this designation in the Examples.

In the Examples, parts by weight (p.b.w.) and parts by volume (p.b.v.) have the relationship of the g to the ml. Unless otherwise stated, percentage ratios and quantity ratios are to be understood as weight units.

General Instruction A for the Preparation of Compounds of the Formula I 0.5 mole of dihalogenoalkane per mole of base was added dropwise to the solution of a base, for example sodium alcoholate, and an excess (molar ratio 1:5) of a methylene-active compound alkyl-OOC—CH$_2$—A in a solvent, such as alcohol or tetrahydrofuran. After heating for 2 to 8 hours under reflux, first the solvent and then the excess of methylene-active compound were distilled off in vacuo. Water was added to the residue, and the mixture was acidified and extracted with methylene chloride. The bis-alkylation product remaining after drying, filtration and evaporation of the solvent was subjected to fractional distillation in vacuo (yield a).

The bis-alkylation product obtained after the distillation was treated with potassium hydroxide in alcohol, in a molar ratio of 1:2. After stirring for 12 hours at room temperature, the alcohol was distilled off. After the addition of water and extraction with ether, the aqueous-alkaline phase was acidified with concentrated hydrochloric acid. The dicarboxylic acid was obtained as a crude product (yield b) from the aqueous-acid phase extracted with ether, and first diethylamine in a molar ratio of 1:2 and then 85 ml of 35% aqueous formaldehyde solution per mole of diethylamine were added to the crude product. Subsequent to the clearly visible evolution of $CO_2$, two phases generally formed within 12 hours. After acidification, the aqueous phase was extracted with ether. The residue obtained after conventional working-up was subjected to fractional distillation in vacuo (yield c).

The compounds 1 to 13 thus obtained have IR and NMR spectra which are in agreement with the allocated structures, and this is confirmed by the analytical data. The yields of the individual stages and the NMR signals of the vinyl protons are indicated in Table 1.

TABLE 1

| | Compounds of the general Formula I | | | | |
|---|---|---|---|---|---|
| Compound No. | $R_1$ | A | Yield, % of Theoretical | NMR signals of the vinyl protons | |
| | | | | δ(ppm) | (CDCl$_3$) |
| 1 | —(CH$_2$)$_2$— | COOC$_2$H$_5$ | (a) 6* (b) 83 (c) 31 | 6.16 | 5.50 |
| 2 | —(CH$_2$)$_3$— | COOC$_2$H$_5$ | (a) 81 (b) 97 (c) 54 | 6.22 | 5.59 |
| 3 | —(CH$_2$)$_4$— | COOC$_2$H$_5$ | (a) 2** (b) 79 (c) 50 | 6.14 | 5.52 |
| 4 | —(CH$_2$)$_5$— | COOC$_2$H$_5$ | (a) 81 (b) 99 (c) 48 | 6.13 | 5.50 |
| 5 | —(CH$_2$)$_6$— | COOC$_2$H$_5$ | (a) 89 (b) 99 (c) 58 | 6.10 | 5.47 |
| 6 | —(CH$_2$)$_{10}$— | COOC$_2$H$_5$ | (a) 77 (b) 98 (c) 62 | 6.12 | 5.50 |
| 7 | —(CH$_2$)$_2$—O—(CH$_2$)$_2$— | COOC$_2$H$_5$ | (a) 18 (b) 94 (c) 32 | 6.22 | 5.62 |
| 8 | —(CH$_2$CH$_2$—O)$_2$(CH$_2$)$_2$— | COOC$_2$H$_5$ | (a) 49 (b) 95 (c) 38 | 6.23 | 5.65 |
| 9 | —(CH$_2$CH$_2$—O)$_3$(CH$_2$)$_2$— | COOC$_2$H$_5$ | (a) 32 (b) 99 (c) 50 | 6.24 | 5.66 |
| 10 | —CH$_2$—(p-C$_6$H$_4$)—CH$_2$— 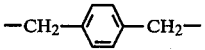 | COOC$_2$H$_5$ | (a) 60 (b) 99 (c) 62 | 6.20 | 5.42 |
| 11 | —CH$_2$—(m-C$_6$H$_4$)—CH$_2$— 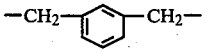 | COOC$_2$H$_5$ | (a) 78 (b) 99 (c) 46 | 6.22 | 5.43 |
| 12 | —CH$_2$—(o-C$_6$H$_4$)—CH$_2$— 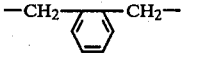 | COOC$_2$H$_5$ | (a) 63 (b) 93 (c) 28 | 6.24 | 5.23 |
| 13 | —(CH$_2$)$_3$— | CN | (a) 55 (b) 80 (c) 62 | 5.85 | 5.71 |

*Main reaction during the bis-alkylation: formation of a three-membered ring
**Main reaction during the bis-alkylation: formation of a five-membered ring

General Instruction B for the Preparation of Alkaldiene-Dicarboxylic Acids

The dicarboxylic acid esters III, obtained according to instruction A, and potassium hydroxide were heated for 5 hours under reflux in aqueous solution in a molar ratio of 1:6, or they were stirred for several days at room temperature. The aqueous phase was acidified and extracted with ethyl acetate. The organic phase was washed with water, dried, filtered and freed from the solvent.

The remaining crystals were recrystallized from the solvent indicated.

The unsaturated dicarboxylic acids 14 to 24 thus obtained had analytical data, IR spectra and NMR spectra, which were in agreement with the allocated structures. To characterize the compounds, their melting points and the NMR signals of the vinyl protons are indicated in Table 2.

TABLE 2

Compounds of the general formula II
$A_1=OH$

| Compound No. | $R_1$ | Yield, % of theoretical | Melting point °C. | NMR signals of the vinyl protons $\delta$(ppm) | ($d_6$-DMSO) |
|---|---|---|---|---|---|
| 14 | $-(CH_2)_2-$ | 69 | 185–187* | 5.97 | 5.47 |
| 15 | $-(CH_2)_3-$ | 77 | 105–106** | 5.97 | 5.50 |
| 16 | $-(CH_2)_4-$ | 50 | 170–172* | 5.94 | 5.48 |
| 17 | $-(CH_2)_5-$ | 77 | 95*** | 5.93 | 5.47 |
| 18 | $-(CH_2)_6-$ | 69 | 127–128* | 5.93 | 5.44 |
| 19 | $-(CH_2)_{10}-$ | 65 | 108–110** | 5.93 | 5.46 |
| 20 | $-(CH_2)_2-O-(CH_2)_2-$ | 56 | 94–95** | 6.00 | 5.55 |
| 21 | $-(CH_2CH_2-O)_2-(CH_2)_2-$ | 64 | 64–66*** | 6.33 | 5.74**** |
| 22 | $-CH_2-\langle C_6H_4 \rangle-CH_2-$ | 68 | 209–211* | 6.02 | 5.45 |
| 23 | $-CH_2-\langle C_6H_4 \rangle-CH_2-$ | 50 | 145–147*** | 6.05 | 5.45 |
| 24 | $-CH_2-\langle C_6H_4 \rangle-CH_2-$ | 51 | 192–194** | 6.04 | 5.17 |

*Recrystallized from ethyl acetate
**Recrystallized from isopropyl ether
***Recrystallized from cyclohexane/ethyl acetate
****NMR spectrum measured in CDCl₃

General Instruction C for the Preparation of Alkaldiene-Dicarboxylic Acid Esters The dicarboxylic acids II, obtained according to Instruction B, were heated with monohydric alcohol in a molar ratio of 1:10, in the presence of concentrated sulfuric acid as the catalyst, for 5 hours at 100°–150° C. with stirring. Excess alcohol was largely removed by distillation. The remaining residue was partitioned between methylene chloride and water and the organic phase was dried and filtered. The residue remaining after evaporation of the solvent was subjected to fractional distillation in vacuo, or was recrystallized. The same compounds also can be obtained when a solvent which entrains water, for example toluene, is used additionally. Under these reaction conditions, the excess of alcohol can be reduced. The water of reaction which is formed is removed by heating under reflux, with the aid of a water separator.

The unsaturated dicarboxylic acid esters 25 to 32 thus obtained had the same spectroscopic features as the dicarboxylic acid esters 1 to 12, prepared according to the general instruction A. For characterization of the compounds listed in Table 3, the NMR signals of the vinyl protons are indicated.

TABLE 3

Compounds of the general formula III
$R_1=(CH_2)_3$

| Compound No. | $R_2$ | Yield, % of theoretical | NMR signals of the vinyl protons $\delta$(ppm) | (CDCl₃) |
|---|---|---|---|---|
| 25 | $-(CH_2)_3CH_3$ | 68 | 6.13 | 5.50 |
| 26 | $-CH_3$ | 59 | 6.13 | 5.53 |
| 27 | $-(CH_2)_{11}CH_3$ | 49 | 6.10 | 5.48 |
| 28 | $-CH_2-CH=CH_2$ | 56 | 6.17 | 5.53 |
| 29 | $-(CH_2)_2OC_6H_5$ | 90 | 6.15 | 5.53 |
| 30 | $-(CH_2)_2OCH_3$ | 81 | 6.19 | 5.57 |
| 31 | $-(CH_2)_2Br$ | 85 | 6.24 | 5.60 |
| 32 | $-(CH_2)_2C_6H_5$ | 82 | 6.10 | 5.48 |

TABLE 3-continued

Compounds of the general formula III
$R_1=(CH_2)_3$

| Compound No. | $R_2$ | Yield, % of theoretical | NMR signals of the vinyl protons $\delta$(ppm) | (CDCl₃) |
|---|---|---|---|---|
| 32a | $-CH_2-\langle$furan$\rangle$ | 47 | 6.19 | 5.53 |

General Instruction D for the Preparation of Further Derivatives of the Alkadienedicarboxylic Acids The dicarboxylic acids II obtained according to Instruction B were heated to the boiling point under reflux for 2 hours in excess thionyl chloride. After removing the excess thionyl chloride, the crude dicarboxylic acid chloride was introduced, with cooling, into the solution of an H-active compound—for example a hydroxy compound, an amine, a thio compound, an acid or an amide—in absolute ether or tetrahydrofuran and the equivalent amount of pyridine for intercepting the hydrogen chloride. After stirring at room temperature for several hours, the ether solution was first washed with dilute acid and then with neutral water. After drying and removal of the solvent, the residue was purified by distillation or crystallization.

The acid derivatives 33 to 37 thus obtained had IR spectra and NMR spectra, which were in agreement with the allocated structures. The characteristic signals for the vinyl protons in the NMR spectrum are indicated in Table 4.

TABLE 4

Compounds of the general formula II
$R_1 = (CH_2)_3$

| Compound No. | $A_1$ | Yield, % of theoretical | NMR signals of the vinyl protons $\delta$ (ppm) | (CDCl₃) |
|---|---|---|---|---|
| 33* | $-NH_2$ | 56 | 5.59 | 5.20** |
| 33a | $-N(C_2H_5)_2$ | 35 | 5.08 | |

TABLE 4-continued

| Compounds of the general formula II $R_1 = (CH_2)_3$ | | | |
|---|---|---|---|
| Compound No. | $A_1$ | Yield, % of theoretical | NMR signals of the vinyl protons δ (ppm) (CDCl₃) |
| 34 | —NHC₆H₅ | 72 | 5.64  5.31 |
| 35 | —OC₆H₅ | 67 | 6.38  5.73 |
| 36 | —SC₆H₅ | 75 | 6.19  5.64 |
| 37 | —OCOC₆H₅ | 87 | 6.38  5.89 |

*The bis-amide was obtained by introducing the bis-acid chloride into an aqueous ammonia solution
**The NMR spectrum of the bis-amide was recorded in d₆-DMSO.

General Instruction E for the Preparation of Dinitroalkadienes 0.1 mole of formaldehyde as an aqueous solution was added dropwise at 0° C., with stirring, to a solution of 0.1 mole of diethylamine in 15 ml of water. The temperature was kept below 10° C. After 30 minutes, 50 millimoles of dinitroalkane were added dropwise. Stirring at 15° C. was continued for 1.5 hours and the mixture was extracted with ether. The ether-soluble bis-diethylaminomethyl compound was precipitated as the dihydrochloride by passing dry HCl gas in. The thermolysis of the Mannich base dihydrochloride was carried out at 110°–150° C. in a high vacuum. The dinitroalkadienes were purified by distillation or crystallization. To characterize the compound 38 prepared in this way, the NMR signals of the vinyl protons are indicated in Table 5.

General Instruction F for the Preparation of Diformylalkadienes

An aqueous solution of 0.5 mole of alkanedialdehyde, 1 mole of formaldehyde and 1 mole of dimethylammonium chloride was heated under reflux to the boiling point for 24 hours. The crude product was subjected to a steam distillation. The distillate was extracted with ether. After drying over sodium sulfate, the solvent of the organic phase was removed. The compound 39 prepared in this way is characterized by the NMR signals of the vinyl protons in Table 5.

General Instruction G for the Preparation of Dicyanoalkadienes 0.22 mole of chlorosulfonyl isocyanate was added dropwise to a solution of 0.1 mole of the dicarboxylic acids, obtained according to Instruction B, in 100 ml of toluene.

Stirring at 60° C. was continued for 3 hours until the evolution of $CO_2$ had ceased. After cooling to room temperature, 40 g of dimethylformamide were added, the mixture was poured onto ice and the phases were separated. The organic phase was washed, dried and freed from solvent. The remaining oil was subjected to fractional distillation. The dinitriles obtained according to Instruction G are identical with the dicyano compounds prepared according to Instruction A.

The yield and the NMR signals of the vinyl protons of the compound 40, prepared by this process, are indicated in Table 5.

General Instruction H for the Preparation of Diformylalkadienes

A solution of 0.2 mole of diisobutylaluminum hydride in toluene was added dropwise under nitrogen, at −30° C., to a solution of 0.1 mole of the dicyanoalkadienes, obtained according to Instructon A or G, in 250 ml of anhydrous toluene. After further stirring for 2 hours at −30° C., the mixture was acidified with dilute sulfuric acid and the organic phase was separated off. The toluene phase was washed, dried and freed from solvent. If necessary, the remaining oil was purified by distillation. The yield and the NMR signals of the vinyl protons of the compounds 41 and 42 prepared according to this instruction are indicated in Table 5.

General Instruction I for the Preparation of Diketoalkadienes 50 ml of acetic anhydride were added dropwise to a solution of 0.1 mole of diketoalkane in 50 ml of bis-(dimethylamino)-methane. Then, the mixture was heated at 90° C. for a further 8 hours. After removal of the low-boiling constituents, the crude product obtained was purified by column chromatography and subsequent distillation or recrystallization.

The yield and the NMR signals of the vinyl protons of the compounds 45 to 47, prepared according to this instruction, are indicated in Table 5.

General Instruction K for the Preparation of Diketoalkadienes

The dicarboxylic acids II obtained according to Instruction B were heated to the boiling point under reflux for 2 hours in excess thionyl chloride. After removing the excess thionyl chloride, the dicarboxylic acid chloride was distilled in vacuo. The acid chloride was added dropwise, at 0° C., in a nitrogen atmosphere, to a solution of equimolar quantities of aluminum alkyl in methylene chloride. Upon termination of the addition, the mixture was stirred for one hour. Then the reaction mixture was allowed to flow into water. The crude product obtained could be purified by a steam distillation.

The yield and the NMR signals of the vinyl protons of the compound 48, prepared by this process, are indicated in Table 5.

TABLE 5

| Compounds of the general formula I | | | | | |
|---|---|---|---|---|---|
| Compound No. | $R_1$ | A | Yield, % of theoretical | NMR signals of the vinyl protons δ (ppm) | (CDCl₃) |
| 38 | —(CH₂)₃— | NO₂ | 30 | 6.45 | 5.60 |
| 39 | —CH₂— | CHO | 25 | 6.28 | 6.08 |
| 40 | —(CH₂)₆— | CN | 73 | 5.80 | 5.68 |
| 41 | —(CH₂)₃— | CHO | 51 | 6.25 | 6.00 |
| 42 | —(CH₂)₆— | CHO | 59 | 6.23 | 5.97 |
| 43 | —CH₂— | C=N—OH* | 49 | 5.32 | 5.19** |
| 44 | —CH₂— | C=N—NHC₆H₅* | 81 | 5.18** | |
| 45 | —CH₂— | COC₆H₅ | 23 | 5.96 | 5.70 |
| 46 | —(CH₂)₂— | COC₆H₅ | 61 | 5.87 | 5.64 |
| 47 | —(CH₂)₃— | COC₆H₅ | 69 | 5.85 | 5.60 |

TABLE 5-continued

| | Compounds of the general formula I | | | | |
|---|---|---|---|---|---|
| Compound No. | $R_1$ | A | Yield, % of theoretical | NMR signals of the vinyl protons | |
| | | | | δ (ppm) | (CDCl$_3$) |
| 48 | —(CH$_2$)$_3$— | COCH$_3$ | 51 | 5.99 | 5.72 |

*The oximes and hydrazones were obtained in the customary manner from the corresponding aldehydes and ketones
**The NMR spectrum was recorded in d$_6$-DMSO

EXAMPLE 1

Electrochemically roughened and anodized aluminum, having an oxide layer of 3 g/m², which had been pretreated with an aqueous solution of polyvinylphosphonic acid, was used as the support for printing plates. The support was coated with a solution of the following composition:

- 11.7 parts by weight of a 34.7% solution of a methyl methacrylate/methacrylic acid copolymer, having an acid number of 110 and a mean molecular weight of 35,000, in methyl ethyl ketone,
- 2.0 parts by weight of one of the compounds 1–48 (Table 6),
- 2.0 parts by weight of trimethylolethane triacrylate,
- 0.07 part by weight of 9-phenyl-acridine,
- 0.07 part by weight of 4-dimethylamino-4'-methyl-dibenzalacetone,
- 0.04 part by weight of an azo dyestuff obtained from 2,4-dinitro-6-chloro-benzenediazonium salt and 2-methoxy-5-acetyl-amino-N-cyanoethyl-N-hydroxy-ethyl-aniline,
- 38.0 parts by weight of ethylene glycol monoethyl ether and
- 13.5 parts by weight of butyl acetate.

The application was effected by whirler-coating in such a way that a dry weight of 2.8–3 g/m² was obtained. Then, the plate was dried for 2 minutes at 100° C. in a circulating air oven.

The light-sensitive coated plate was coated with a 15% aqueous solution of polyvinyl alcohol (12% of residual acetyl groups, K value 4). After drying, a cover layer having a weight of 4–5 g/m² was obtained.

The printing plate obtained was exposed for 30 seconds using a 5 kW metal halide lamp at a distance of 110 cm under a 13-step exposure wedge with density increments of 0.15.

The plate was then developed with a developer of the following composition:

- 120 parts by weight of sodium metasilicate. 9 H$_2$O,
- 2.13 parts by weight of strontium chloride,
- 1.2 parts by weight of non-ionic wetting agent (coconut fatty alcohol polyoxyethylene ether with about 8 oxyethylene units),
- 0.12 part by weight of an antifoam agent, and
- 4,000 parts by weight of fully deionized water.

The plate was rendered acidic with 1% phosphoric acid and was inked with greasy printing ink. The following fully cross-linked wedge steps were obtained:

TABLE 6

| Compound No. | Wedge Steps |
|---|---|
| 1 | 3 |
| 2 | 6 |
| 3 | 2 |
| 4 | 3 |
| 5 | 3 |
| 6 | 1 |
| 7 | 2 |

TABLE 6-continued

| Compound No. | Wedge Steps |
|---|---|
| 8 | 3 |
| 9 | 2 |
| 10 | 1 |
| 11 | 1 |
| 12 | 1 |
| 13 | 4 |
| 14 | 2 |
| 15 | 3 |
| 16 | 2 |
| 17 | 3 |
| 18 | 2 |
| 19 | 1 |
| 20 | 1 |
| 21 | 1 |
| 22 | ½ |
| 23 | ½ |
| 24 | 1 |
| 25 | 3 |
| 26 | 4 |
| 27 | 1 |
| 28 | 5 |
| 29 | 2 |
| 30 | 5 |
| 31 | 1 |
| 32 | 2 |
| 32a | 2 |
| 33 | 3 |
| 33a | 2 |
| 34 | 2 |
| 35 | 2 |
| 36 | 1 |
| 37 | 2 |
| 38 | 1 |
| 39 | 2 |
| 40 | 3 |
| 41 | 2 |
| 42 | 1 |
| 43 | 1 |
| 44 | 1 |
| 45 | 1 |
| 46 | 1 |
| 47 | 2 |
| 48 | 2 |

EXAMPLE 2

A solution of the following composition was whirler-coated onto the support indicated in Example 1 in such a way that a layer weight of 3 g/m² was obtained:

- 11.7 parts by weight of the copolymer solution indicated in Example 1,
- 38.0 parts by weight of ethylene glycol monoethyl ether,
- 13.5 parts by weight of butyl acetate,
- 3.9 parts by weight of one of the monomers indicated in Table 7,
- 0.07 part by weight of 9-phenyl-acridine,
- 0.04 part by weight of the azo dyestuff indicated in Example 1, and
- 0.07 part by weight of 4-dimethylamino-4'-methyl-dibenzalacetone.

The plate was processed further in the same way as in Example 1.

The following number of fully cross-linked wedge steps was obtained:

TABLE 7

| Compound No. | Exposure Time (seconds) | Wedge Steps |
|---|---|---|
| 1 | 15 | 1 |
|   | 30 | 3 |
| 2 | 15 | 3 |
|   | 30 | 6 |
| 4 | 15 | 1 |
|   | 30 | 2 |
| 5 | 15 | 1 |
|   | 30 | 3 |
| 8 | 15 | 1 |
|   | 30 | 3 |
| 13 | 15 | 1 |
|   | 30 | 2 |
| 15 | 15 | 1 |
|   | 30 | 3 |
| 17 | 15 | 1 |
|   | 30 | 3 |
| 25 | 15 | 1 |
|   | 30 | 3 |
| 26 | 15 | 2 |
|   | 30 | 4 |
| 28 | 15 | 2 |
|   | 30 | 4 |
| 30 | 15 | 2 |
|   | 30 | 4 |

Comparable results were obtained when 2,2-dimethoxy-2-phenyl-acetophenone or 2-(4-ethoxy-naphth-1-yl)-4,6-bis-trichloromethyl-s-triazine or 2-(acenaphth-5-yl)-4,6-bis-trichloromethyl-s-triazine was used in place of 9-phenylacridine.

Using compound 2, a printing trial was carried out. For this purpose, the offset printing plate inked with greasy ink was clamped into a commercially available printing press (Heidelberg GTO type). The printing trial was stopped after 200,000 prints, even though breaks in the dots of the 150 dot half-tone screen were not yet detectable.

EXAMPLE 3

A solution of the following composition was whirler-coated onto the support indicated in Example 1 in such a way that a layer weight of 3.5 g/m² was obtained:
  10.0 parts by weight of a 21.7% solution of a terpolymer of styrene, n-hexyl methacrylate and methacrylic acid (10:60:30), having an acid number of 190, in butanone,
  2.0 parts by weight of compound 2,
  0.06 part by weight of 9 phenyl-acridine and
  0.03 part by weight of methyl violet (C.I. 42,535) in
  18.0 parts by weight of butanone and
  7.5 parts by weight of butyl acetate.

The coated plate was then dried for 2 minutes at 100° C. in a circulating air oven and provided with a cover layer as in Example 1. The plate was exposed for 4, 8, 15, and 30, seconds under a 13-step exposure wedge as described in Example 1 and was developed with a developer of the following composition:
  5.3 parts by weight of sodium metasilicate. 9 H₂O,
  3.4 parts by weight of tert. sodium phosphate. 12 H₂O,
  0.3 part by weight of sec. sodium phosphate. 12 H₂O, and
  91.0 parts by weight of fully deionized water.

The plate was rendered acidic with 1% phosphoric acid and inked with greasy printing ink. Counting out of the fully cross-linked gloss steps gave the following pattern:

| Exposure time: 5 kW metal halide lamp | Seconds | | | |
|---|---|---|---|---|
|  | 4 | 8 | 15 | 30 |
| corresponding fully cross-linked gloss steps | 1 | 3 | 5 | 7 |

EXAMPLE 4

A solution as described in Example 3 was whirler-coated onto a cleaned support, which consisted of an insulating material with a 35 μm copper deposit, in such a way that a layer thickness of about 5 μm was obtained. The layer was dried for a further 5 minutes at 100° C. in a circulating air oven. Then, a cover layer as in Example 1 was applied. The coating and drying process also can be carried out on both sides.

Then, the plate was exposed for 2, 4, 8, 16, 32, and 64, seconds using a 5 kW metal halide lamp at a distance of 140 cm under a step wedge, as described in Example 1, and the plate was developed in a spray processor with a 0.8% sodium carbonate solution for a period of between 30 and 60 seconds.

The following fully cross-linked wedge steps were obtained:

| Exposure Time (seconds) | Wedge Steps |
|---|---|
| 2 | 1 |
| 4 | 2 |
| 8 | 5 |
| 16 | 7 |
| 32 | 9 |
| 64 | 11 |

When the cross-linkable layer was exposed under a circuit original and developed, the cross-linked areas were resistant to the iron-III chloride solution customary in printed circuit board technology. The etch resistance was good.

EXAMPLE 5

A coating solution was prepared from
  1.4 parts by weight of a styrene/maleic anhydride copolymer having an acid number of 190 and a mean molecular weight of about 10,000,
  1.3 parts by weight of compound 26,
  0.2 part by weight of 1,6-di-hydroxyethoxy-hexane,
  0.1 part by weight of benzo(a)phenazine,
  0.02 part by weight of dyestuff as in Example 1 and
  17.0 parts by weight of ethylene glycol monoethyl ether
and applied by whirler-coating to electrolytically roughened 0.3 mm thick aluminum, as described in Example 1, and provided with a cover layer. The exposure, development and assessment were carried out as in Example 1. 3 wedge steps were obtained.

EXAMPLE 6

A coating solution was prepared from
  1.4 parts by weight of compound 2,
  1.4 parts by weight of a methyl methacrylate/methacrylic acid copolymer having a mean molecular weight of 60,000 and an acid number of 94,
  0.1 part by weight of 9-phenyl-acridine,
  0.2 part by weight of 1,6-di-hydroxyethoxy-hexane, 0.02 part by weight of Supranolblau-GL (C.I. 50,335), and 13.0 parts by weight of ethylene glycol monoethyl ether and whirler-coated onto electrolytically roughened and anodized 0.3 mm thick aluminum and provided, as in Example 1, with a cover layer. The exposure, development and assessment were carried out as in Example 1. The number of wedge steps of maximum density was 4.

EXAMPLE 7

In this example, a comparison was carried out between compound 2 and trimethylolethane triacrylate as the monomer:

Solution A
- 11.7 parts by weight of binder solution as in Example 1,
- 3.9 parts by weight of compound 2,
- 0.07 part by weight of 9-phenyl-acridine,
- 0.07 part by weight of 4-dimethylamino-4'-methyl-dibenzalacetone,
- 0.04 part by weight of dyestuff as described in Example 1,
- 38.0 parts by weight of ethylene glycol monoethyl ether and
- 13.5 parts by weight of butyl acetate.

Solution B
- 11.7 parts by weight of binder solution as in Example 1,
- 3.9 parts by weight of trimethylolethane triacrylate,
- 0.07 part by weight of 9-phenyl-acridine,
- 0.07 part by weight of 4-dimethylamino-4'-methyl-dibenzalacetone,
- 0.04 part by weight of dyestuff as described in Example 1,
- 38.0 parts by weight of ethylene glycol monoethyl ether and
- 13.5 parts by weight of butyl acetate.

The two solutions were whirler-coated under the same conditions onto electrolytically roughened and anodized 0.3 mm thick aluminum and provided, as in Example 1, with a cover layer. The exposure, development and assessment were carried out as in Example 1. With 30 seconds' exposure, the number of wedge steps of maximum density was 6 for solution A, and 4 for solution B.

EXAMPLE 8

For the manufacture of color proofing films, four coating solutions were prepared corresponding to Example 2 with compound 26 and 0.05 part by weight of 9-phenyl-acridine as the initiator, and one of the dyestuffs listed below was added to each:

(a) yellow film: 0.04 part by weight of Fettgelb 3 G (C.I. 12,700)
(b) red film: 0.02 part by weight of Zaponechtrot ® BE (C.I. 12,715) and 0.02 part by weight of Zaponechtrot BB (C.I. Solvent Red 71)
(c) blue film: 0.02 part by weight of Zaponechtblau ® HFL (C.I. 74,350)
(d) black film: 0.04 part by weight of Fettschwarz HB (C.I. 26,150).

These solutions were whirler-coated onto 180 μm thick, biaxially stretched polyester films and dried for two minutes at 100° C. The layers were then provided with a 1-2 μm thick coating of polyvinyl alcohol and exposed, as in Example 1, under the corresponding silver film color separations (the blue film was exposed for 1 minute, the red film for 2 minutes, and the yellow and black films each for 5 minutes). Development was carried out as in Example 1.

When the color proofing films were superposed, a duplicate true in color, corresponding to the original, was formed.

EXAMPLE 9

A coating solution was prepared from
- 2.9 parts by weight of compound 2,
- 4.9 parts by weight of a methyl methacrylate/methacrylic acid copolymer having a mean molecular weight of 40,000 and an acid number of 125,
- 0.3 part by weight of 9-phenyl-acridine and
- 10.0 parts by weight of methyl ethyl ketone and was slot-die coated onto an 0.3 mm thick aluminum sheet, the edges of which were bent off at an angle of 90°, and the solvent was slowly evaporated by leaving the sheets to stand. Then, the sheet was additionally dried for one hour at 100° C. The 0.6 mm thick photopolymer layer was then exposed for 20 minutes using a three-phase carbon arc lamp of 60 A at a distance of 110 cm under a photographic negative original and was developed for 15 minutes in a rocking bath with the developer described in Example 1.

A firmly adhering relief image of light yellow tone was obtained and, after removal of the edges, this could be employed for letterpress printing or letterset printing.

EXAMPLE 10

A solution of the following composition was whirler-coated onto the support indicated in Example 1 in such a way that a layer weight of 3.5 g/m² was obtained:
- 2.6 parts by weight of compound 2,
- 6.5 parts by weight of a styrene/maleic acid ester copolymer having an acid number of 145–160 and a softening point of 140°–160° C.,
- 70.0 parts by weight of ethylene glycol monomethyl ether,
- 0.1 part by weight of 9-phenyl-acridine,
- 0.035 part by weight of the azo dyestuff indicated in Example 1, and
- 1.0 part by weight of the reaction product of 1 mole of 2,2,4-trimethyl-hexamethylene diisocyanate and 2 moles of 2-hydroxyethyl methacrylate.

The coated plate was then dried for 2 minutes at 100° C. in a circulating air oven and provided with a cover layer as in Example 1. The plate was irradiated with 200 mW and 1,200 L/inch=5.3 mJ/cm² on a Laserite ® 150 R apparatus from Messrs. Eocom Corporation. The image contrast after the exposure was good. Then, the plate was developed with the developer of Example 1.

Proofing and production printing were carried out in a Heidelberger GTO offset printing press with a Dahlgren damping system and the run amounted to 150,000 sheets.

It will be obvious to those skilled in the art that many modifications may be made within the scope of the present invention without departing from the spirit thereof, and the invention includes all such modifications.

What is claimed is:

1. A mixture which is polymerizable by radiation and contains, as the essential constituents,
   (a) a polymeric binder,
   (b) a polymerization initiator which can be activated by radiation, and (c) a polymerizable compound of the formula I

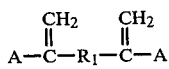

in which $R_1$ is a divalent aliphatic group having 1 to 15 carbon atoms which also can be partially replaced by hetero-atoms, a divalent cycloaliphatic group having 3 to 15 carbon atoms, or a mixed aliphatic-aromatic group having 7 to 15 carbon atoms, and A is an electron-attracting radical.

2. A mixture which is polymerizable by radiation, as claimed in claim 1, which comprises a compound of the formula I, in which A is a radical which is bonded via a carbon atom or nitrogen atom and in which this atom is bonded to at least one hetero-atom which can be O, N or S.

3. A mixture which can be polymerized by radiation, as claimed in claim 1 which comprises a compound of the formula II

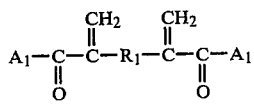

in which $A_1$ denotes a hydrogen atom or an alkyl, aryl, hydroxyl, amino, alkoxy, aryloxy, alkylamino, arylamino, alkylthio, arylthio, acyloxy, acylamino, sulfonyloxy or sulfonylamino group and $R_1$ has the meaning given in claim 1.

4. A mixture which is polymerizable by radiation, as claimed in claim 1, which comprises a compound of the formula III

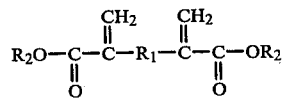

in which $R_2$ is an alkyl or alkenyl radical having 1 to 15 carbon atoms which also can be partially replaced by hetero-atoms, a cycloalkyl radical having 3 to 15 carbon atoms or an aralkyl radical having 7 to 15 carbon atoms and $R_1$ has the meaning given in claim 1.

5. A mixture which is polymerizable by radiation, as claimed in claim 1, which comprises a compound of the formula I, in which $R_1$ is an alkylene group having 1 to 5 carbon atoms.

6. A mixture which is polymerizable by radiation, as claimed in claim 1, which comprises a compound of the formula I, in which A is the CN radical.

7. A mixture which is polymerizable by radiation, as claimed in claim 3, which comprises a compound of the formula II, in which $A_1$ is an alkyl group having 1 to 2 carbon atoms.

8. A mixture which is polymerizable by radiation, as claimed in claim 3, which comprises a compound of the formula II, in which $A_1$ is a hydrogen atom.

9. A mixture which is polymerizable by radiation, as claimed in claim 4, which comprises a compound of the formula III, in which $R_2$ is an alkyl group having 1 to 4 carbon atoms.

10. A radiation-sensitive copying material, comprising a support and a layer which is polymerizable by radiation and contains, as the essential constituents,
(a) a polymeric binder,
(b) a polymerization initiator which can be activated by radiation, and
(c) a compound of the formula I

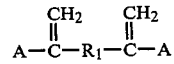

in which $R_1$ is a divalent aliphatic group having 1 to 15 carbon atoms which also can be partially replaced by hetero-atoms, a divalent cycloaliphatic group having 3 to 15 carbon atoms, or a mixed aliphatic-aromatic group having 7 to 15 carbon atoms, and A is an electron-attracting radical.

* * * * *